United States Patent
Kitagawa et al.

(10) Patent No.: US 10,189,928 B2
(45) Date of Patent: Jan. 29, 2019

(54) CURABLE COMPOSITION, PATTERN FORMING METHOD, PATTERN, AND METHOD FOR MANUFACTURING DEVICE

(71) Applicant: FUJIFILM Corporation, Tokyo (JP)

(72) Inventors: Hirotaka Kitagawa, Haibara-gun (JP); Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/465,080

(22) Filed: Mar. 21, 2017

(65) Prior Publication Data

US 2017/0190820 A1 Jul. 6, 2017

Related U.S. Application Data

(63) Continuation of application No. PCT/JP2015/076855, filed on Sep. 24, 2015.

(30) Foreign Application Priority Data

Sep. 26, 2014 (JP) .................. 2014-196187

(51) Int. Cl.
| | | |
|---|---|---|
| *C08F 222/10* | (2006.01) | |
| *B41J 2/01* | (2006.01) | |
| *C08F 2/48* | (2006.01) | |
| *B29C 59/02* | (2006.01) | |
| *B29C 59/00* | (2006.01) | |
| *G03F 7/00* | (2006.01) | |
| *H01L 21/027* | (2006.01) | |
| *G03F 7/027* | (2006.01) | |
| *B29K 33/00* | (2006.01) | |
| *B29K 105/00* | (2006.01) | |

(52) U.S. Cl.
CPC .......... *C08F 222/10* (2013.01); *B29C 59/005* (2013.01); *B29C 59/02* (2013.01); *B41J 2/01* (2013.01); *C08F 2/48* (2013.01); *G03F 7/0002* (2013.01); *G03F 7/027* (2013.01); *H01L 21/0271* (2013.01); *B29K 2033/08* (2013.01); *B29K 2105/0002* (2013.01); *C08F 2222/102* (2013.01); *C08F 2222/1013* (2013.01)

(58) Field of Classification Search
CPC ..... C08F 222/10; B29C 59/005; B29C 59/02; H01L 21/0271; B41J 2/01; G03F 7/0002; B29K 2105/0002; B29K 2033/08
See application file for complete search history.

(56) References Cited

U.S. PATENT DOCUMENTS

| | | | | |
|---|---|---|---|---|
| 2009/0283937 A1* | 11/2009 | Kodama | ................. | B82Y 10/00 264/447 |
| 2010/0133728 A1 | 6/2010 | Yonezawa et al. | | |
| 2011/0043719 A1* | 2/2011 | Thunhorst | ......... | G02F 1/133308 349/58 |
| 2013/0288021 A1* | 10/2013 | Hayashida | ............. | B82Y 10/00 428/195.1 |
| 2014/0374884 A1* | 12/2014 | Kitagawa | .............. | C08F 220/18 257/618 |

FOREIGN PATENT DOCUMENTS

| | | |
|---|---|---|
| JP | 2013-189537 A | 9/2013 |
| KR | 10-2010-063664 A | 6/2010 |
| KR | 10-2010-0121462 A | 11/2010 |
| KR | 10-2014-0043312 A | 4/2014 |

OTHER PUBLICATIONS

"Kayarad Product Guide," Kayarad Kayamer Kayacure, Radiation Curable Products, 1st ed. Nippon Kayaku Co., Ltd., no date.*
International Preliminary Report on Patentability dated Apr. 6, 2017 issued by the International Bureau in PCT/JP2015/076855 with the translation of Written Opinion.
International Search Report for PCT/JP2015/076855 dated Dec. 8, 2015.
Written Opinion for PCT/JP2015/076855 dated Dec. 8, 2015.
Office Action dated Dec. 4, 2017 from the Korean Intellectual Property Office in counterpart Korean Application No. 10-2017-7007961.
Office Action dated May 24, 2018 issued by the Korean Intellectual Property Office in counterpart Korean Application No. 10-2017-7007961.
Office Action dated Oct. 26, 2018 in counterpart Korean Patent Application No. 10-2017-7007961.

* cited by examiner

*Primary Examiner* — Jessica M Roswell
(74) *Attorney, Agent, or Firm* — Sughrue Mion, PLLC

(57) ABSTRACT

Provided are a curable composition having excellent releasability and ink jet discharge accuracy, a pattern forming method, a pattern, and a method for manufacturing a device.
The curable composition includes a polymerizable compound and a photopolymerization initiator, in which neopentyl glycol diacrylate accounts for 10% by mass or more of the polymerizable compound, and the total content of a compound represented by the following Formula (I) and a compound represented by the following Formula (II) is 5% by mass or less with respect to the content of neopentyl glycol diacrylate.

(I)

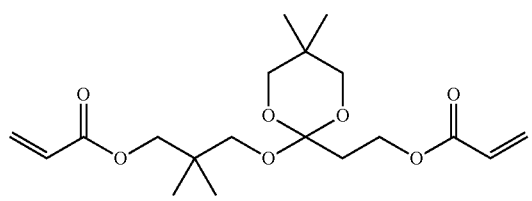

(II)

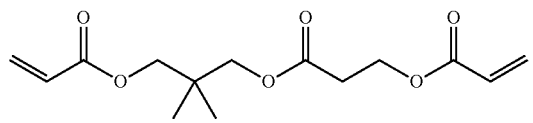

10 Claims, No Drawings

CURABLE COMPOSITION, PATTERN FORMING METHOD, PATTERN, AND METHOD FOR MANUFACTURING DEVICE

CROSS-REFERENCE TO RELATED APPLICATIONS

This application is a Continuation of PCT International Application No. PCT/JP2015/076855 filed on Sep. 24, 2015, which claims priority under 35 U.S.C § 119(a) to Japanese Patent Application No. 2014-196187 filed on Sep. 26, 2014. Each of the above application(s) is hereby expressly incorporated by reference, in its entirety, into the present application

BACKGROUND OF THE INVENTION

1. Field of the Invention

The present invention relates to a curable composition, a pattern forming method, a pattern, and a method for manufacturing a device.

2. Description of the Related Art

An imprint method is a technique in which a mold having a pattern formed therein (which is generally referred to as a mold or a stamper) is pressed to transfer a micropattern onto a material. In a view that by using the imprint method, it is possible to fabricate a micropattern easily and accurately, it has recently been expected to be applicable to various fields. In particular, a nanoimprint technique in which a micropattern at a nano-order level is formed has attracted attentions.

As an imprint method, a thermal imprint method and a method called a photoimprint method have been proposed in terms of its transfer method. The thermal imprint method is a method in which a mold is pressed against a thermoplastic resin that has been heated to the glass transition temperature thereof or higher, and thereafter, the thermoplastic resin is cooled to the glass transition temperature or lower and then released from the mold to transfer a microstructure onto the resin on a substrate.

On the other hand, the photoimprint method is a method in which a curable composition is photo-cured under irradiation with light through a translucent mold or a translucent substrate, and the mold is peeled off so as to transfer a micropattern onto a photocured product. Since this method is an imprint for an uncured product, there is no need for heating at a high pressure and a high temperature, and it is possible to fabricate a micropattern easily. Further, since the method enables imprint at room temperature, it can be applied to a precision machining field for ultramicropatterns, such as manufacture of semiconductor integrated circuits.

Since the imprint method has a step of peeling a mold, it has had a problem in its releasability from the beginning. As a method for improving the releasability, a method in which the surface of a mold is subjected to a release treatment with a release agent such as a silane coupling agent having a perfluoroalkyl group is known. This method has a high effect of improving the releasability since it lowers the surface energy of the surface of the mold, but the release agent is deteriorated as the imprinting is repeated, and therefore, there has been a problem in durability.

JP2013-189537A discloses a curable composition for photoimprints having a high filling rate for a mold, a low release defect density, and high dry etching resistance, which contains a monofunctional monomer, a polyfunctional monomer, and a photopolymerization initiator, and has a viscosity of 15 mPa·s or less at 25° C., an Ohnishi parameter of 3.0 or less, and a crosslinking density of 0.6 mmol/cm$^3$ or more.

SUMMARY OF THE INVENTION

As a method for applying a curable composition upon formation of an ultramicropattern with high accuracy by an imprint method, an ink jet method has attracted attentions.

In order to apply a curable composition by an ink jet method, it is required to reduce the viscosity of the curable composition from the viewpoint of improvement of ink jet discharge properties.

The present inventors have conducted extensive studies, and as a result, they have found that by using neopentyl glycol diacrylate as a polymerizable compound, the viscosity of the curable compound can be reduced, and a curable composition having excellent ink jet discharge accuracy can be obtained.

Furthermore, the present inventors have conducted investigations on a curable composition using neopentyl glycol diacrylate, and as a result, they could find that a Michael adduct, an acetal product produced from the Michael adduct, and the like as the impurities are incorporated into neopentyl glycol diacrylate as a commercially available product. Further, these impurities have an effect on ink jet discharge accuracy or releasability of the mold.

Furthermore, a polyfunctional polymerizable compound such as neopentyl glycol diacrylate is likely to be gelled by polymerization upon distillation if the distillation is performed. Thus, further distillation of neopentyl glycol diacrylate as a commercially available product is not usually carried out. Further, in JP2013-189537A, commercially available neopentyl glycol diacrylate (KAYARAD NPGDA, manufactured by Nippon Kayaku Co., Ltd.,) is used as it is in Comparative Examples 5, 6, 8, and 9.

Therefore, it is an object of the present invention to provide a curable composition having excellent releasability and ink jet discharge accuracy. It is another object of the present invention to provide a pattern forming method, a pattern, and a method for manufacturing a device.

The present inventors have conducted extensive studies, and as a result, they have found that the objects can be accomplished by setting a total content of a compound represented by Formula (I) which will be described later and a compound represented by Formula (II) which will be described later to 5% by mass or less with respect to the content of neopentyl glycol diacrylate in a curable composition including a polymerizable compound and a photopolymerization initiator, in which neopentyl glycol diacrylate accounts for 10% by mass or more of the polymerizable compound, thereby completing the present invention. The present invention provides the following aspects.

<1> A curable composition comprising a polymerizable compound and a photopolymerization initiator, in which neopentyl glycol diacrylate accounts for 10% by mass or more of the polymerizable compound, and the total content of a compound represented by the following Formula (I) and a compound represented by the following Formula (II) is 5% by mass or less with respect to the content of neopentyl glycol diacrylate:

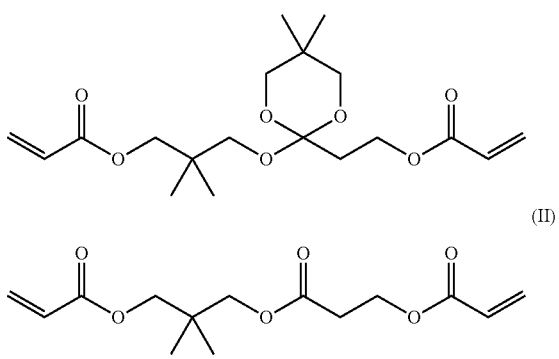

<2> The curable composition as described in <1>, in which the content of the compound represented by Formula (I) is 2% by mass or less with respect to the content of neopentyl glycol diacrylate.

<3> The curable composition as described in <1> or <2>, in which the content of the compound represented by Formula (II) is 2% by mass or less with respect to the content of neopentyl glycol diacrylate.

<4> The curable composition as described in any one of <1> to <3>, in which the polymerizable compound further includes a polymerizable compound having one selected from an alicyclic hydrocarbon structure and an aromatic structure.

<5> The curable composition as described in any one of <1> to <4>, which is used for imprints.

<6> The curable composition as described in any one of <1> to <5>, which is used for ink jet.

<7> A pattern forming method comprising applying the curable composition as described in any one of <1> to <6> on a base material or a mold having a pattern, and irradiating the curable composition with light in a state of keeping the composition sandwiched between the mold and the base material.

<8> The pattern forming method as described in <7>, in which the method for applying the curable composition on the base material or the mold having a pattern is an ink jet method.

<9> A pattern obtained by the pattern forming method as described in <7> or <8>.

<10> A method for manufacturing a device, comprising the pattern forming method as described in <7> or <8>.

According to the present invention, it is possible to provide a curable composition having excellent releasability and ink jet discharge accuracy, a pattern forming method, a pattern, and a method for manufacturing a device.

DESCRIPTION OF THE PREFERRED EMBODIMENTS

Hereinafter, the contents of the present invention will be described in detail. The descriptions of the constituent elements described below are based on representative embodiments of the present invention, but the present invention is not limited to such embodiments.

In the present specification, "(a value) to (a value)" is used to mean a range including the numeral values described before and after "to" as a lower limit value and an upper limit value, respectively.

In the present specification, "(meth)acrylate" means acrylate and methacrylate, "(meth)acryl" means acryl and methacryl, and "(meth)acryloyl" means acryloyl and methacryloyl.

In the present specification, "light" encompasses not only those having wavelengths falling within the ranges of ultraviolet rays, near-ultraviolet rays, far-ultraviolet rays, visible rays, infrared rays, and the like, and electromagnetic waves, but also radiation. Examples of the radiation include microwaves, electron beams, EUV, and X-rays. Further, it is possible to use laser light such as 248-nm excimer laser, 193-nm excimer laser, and 172-nm excimer laser. These types of light may use monochromatic light (single wavelength light) that has passed through an optical filter, or may be light having different wavelengths (composite light).

In the present specification, an "imprint" preferably refers to a pattern transfer of 1 nm to 100 µm in size, or more preferably a pattern transfer of 10 nm to 1 µm in size (nanoimprint).

In citations for a group (atomic group) in the present specification, a group which is denoted without specifying whether it is substituted or unsubstituted encompasses both a group not having a substituent and a group having a substituent. For example, an "alkyl group" includes not only an alkyl group not having a substituent (unsubstituted alkyl group), but also an alkyl group having a substituent (substituted alkyl group).

In the present specification, the mass average molecular weight and the number-average molecular weight of a polymer each refer to a value measured by gel permeation chromatography (GPC) unless otherwise specified. GPC can be measured under the following conditions.

Preparation of a sample: A polymer is dissolved in tetrahydrofuran such that the concentration reaches 0.1% by mass.

GPC device: HLC-8020 GPC (manufactured by Tosoh Corporation)

Column: Three columns connected in series of TSKgel (registered trademark) Super Multipore HZ-H (manufactured by Tosoh Corporation, 4.6 mmID×15 cm)

Column temperature: 40° C.

Detector: Differential refractometer (RI)

Eluant: Tetrahydrofuran

Flow rate: 0.35 mL/min

Sample injection amount: 10 µL

In the present specification, the total solid content refers to a total mass of components excluding a solvent from the total composition of a composition.

In the present specification, the viscosity is a value measured using an E type rotational viscometer RE85L manufactured by Told Sangyo Co., Ltd., at a rotation speed set at 50 rpm at 25±0.2° C. for a polymerizable compound or 23±0.2° C. for a curable composition.

<Curable Composition>

The curable composition of the present invention includes a polymerizable compound and a photopolymerization initiator, in which neopentyl glycol diacrylate accounts for 10% by mass or more of the polymerizable compound, and the total content of a compound represented by the following Formula (I) (hereinafter also referred to as a compound of Formula (I)) and a compound represented by the following Formula (II) (hereinafter also referred to as a compound of Formula (II)) is 5% by mass or less with respect to the content of neopentyl glycol diacrylate.

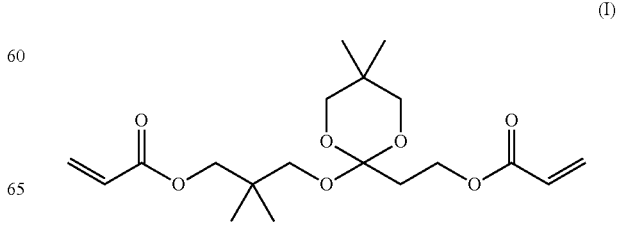

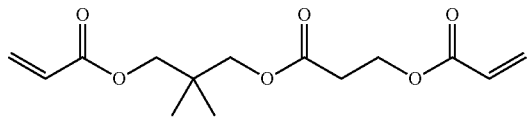
(II)

According to the present invention, it is possible to provide a curable composition having excellent releasability and ink jet discharge accuracy.

Since the curable composition of the present invention includes neopentyl glycol diacrylate as the polymerizable compound, the viscosity of the curable composition can be lowered.

Furthermore, neopentyl glycol diacrylate (NPGDA) can be produced by subjecting neopentyl glycol and acrylic acid to dehydration and condensation by heating them in the presence of an acid catalyst. A commercially available neopentyl glycol diacrylate thus produced contains compounds of Formulae (I) to (III) as the impurities. The mechanism by which these impurities are produced is thought to be a mechanism as shown in the following formula. That is, it is thought that neopentyl glycol and acrylic acid are subjected to dehydration and condensation to produce a compound of Formula (III), and then the compound of Formula (III) and acrylic acid are subjected to dehydration and condensation to produce NPGDA; acrylic acid is subjected to a Michael addition to a conjugated double bond of the produced NPGDA to produce a compound of Formula (II) as a by-product; and further, neopentyl glycol is subjected to dehydration and condensation to a carbonyl group of an ester bond of the compound of Formula (II) to produce a compound of Formula (I) as a by-product.

compound of Formula (I) and the compound of Formula (II) to 5% by mass or less with respect to the content of neopentyl glycol diacrylate, and thus, the ink jet discharge accuracy can be improved.

In addition, unexpectedly, it was found that when the content of the compound of Formula (I) is set to be low, the releasability is further improved. It is thought that the compound of Formula (I) deteriorates the releasability through the interaction of ethereal oxygen with a silanol group on the surface of a mold.

Here, "NK ESTER A-NPG" manufactured by Shin-Nakamura Chemical Co., Ltd., "LIGHT ACRYLATE NP-A" manufactured by Kyoeisha Chemical Co., Ltd., "KAYARADNPGDA" manufactured by Nippon Kayaku Co., Ltd., and the like are known as a commercially available neopentyl glycol diacrylate.

However, as shown in Examples which will be described later, "NK ESTER A-NPG" manufactured by Shin-Nakamura Chemical Co., Ltd. is a mixture in which the content of neopentyl glycol diacrylate is 90.0%, the content of the compound of Formula (I) is 7.4%, the content of the compound of Formula (II) is 1.5%, and the content of the compound of Formula (III) is 0.7%, and has a viscosity at 25° C. of 5.6 mPa·s. "LIGHT ACRYLATE NP-A" manufactured by Kyoeisha Chemical Co., Ltd. is a mixture in which the content of neopentyl glycol diacrylate is 89.8%, the content of the compound of Formula (I) is 6.4%, the content of the compound of Formula (II) is 1.5%, and the content of the compound of Formula (III) is 1.8%, and has a viscosity at 25° C. of 5.5 mPa·s.

In addition, in paragraph No. 0136 of JP2005-227761A, it is described that "KAYARAD NPGDA" manufactured by Nippon Kayaku Co., Ltd. has a viscosity at 25° C. of 7 mPa·s. Since the compound of Formula (I) and the com-

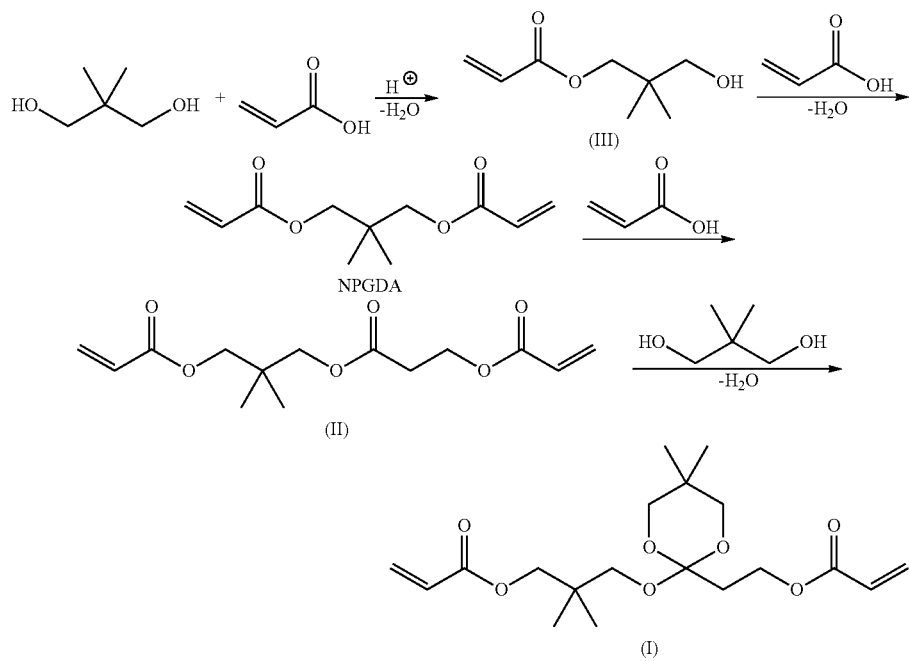

Since the compound of Formula (I) and the compound of Formula (II) have high viscosity, as compared with neopentyl glycol diacrylate, reduction in the viscosity of the composition can be accomplished by setting a total content of the compound of Formula (I) and the compound of Formula (II) have high viscosity, as compared with neopentyl glycol diacrylate, as the content of the compound of Formula (I) and the compound of Formula (II) increases, the viscosity increases. From this, it is expected that the content (purity) of neopentyl glycol diacrylate in "KAY-ARAD NPGDA" manufactured by Nippon Kayaku Co., Ltd. is lower than that of "NK ESTER A-NPG" manufactured by Shin-Nakamura Chemical Co., Ltd. or "LIGHT ACRYLATE NP-A" manufactured by Kyoeisha Chemical Co., Ltd.

Furthermore, the content (purity) of neopentyl glycol diacrylate is a value determined from a peak area ratio by means of gas chromatography, as measured under the conditions described in Examples which will o be described later.

The curable composition of the present invention can be preferably used as a curable composition for imprints.

Incidentally, the curable composition of the present invention can be preferably used as a curable composition for ink jet.

Hereinafter, each composition of the curable composition of the present invention will be described.

<<Polymerizable Compound>>

As a polymerizable compound, one including at least neopentyl glycol diacrylate is used.

The content of the polymerizable compound in the curable composition is preferably 70% to 99% by mass, more preferably 80% to 99% by mass, and more preferably 90% to 99% by mass, with respect to the total composition excluding the solvent. In a case of using two or more kinds of polymerizable compounds, it is preferable that the total amount thereof falls within the range.

In the present invention, it is preferable that neopentyl glycol diacrylate accounts for 10% by mass or more, and more preferably 15% by mass or more, of the total mass of the polymerizable compound, and the upper limit is preferably 90% by mass or less, more preferably 80% by mass or less, and still more preferably 60% by mass or less.

As described above, the compounds represented by Formulae (I) and (II) are included as impurities in commercial neopentyl glycol diacrylate. Therefore, as the content of neopentyl glycol diacrylate in the composition increases, the content of Formulae (I) and (II) also increases. As a result, there is tendency that the viscosity of the curable composition increases, and thus, the ink jet discharge accuracy decreases or the mold releasability decreases.

In the present invention, since the total content of the compound of Formula (I) and the compound of Formula (II) is 5% by mass or less with respect to the content of neopentyl glycol diacrylate, the ink jet discharge accuracy and the mold releasability are good.

The total content of the compound of Formula (I) and the compound of Formula (II) is preferably 4.5% by mass or less, more preferably 3.5% by mass or less, and still more preferably 2.0% by mass or less.

Furthermore, the content of the compound of Formula (I) is preferably 2% by mass or less, more preferably 1% by mass or less, and still more preferably 0.5% by mass or less, with respect to the content of neopentyl glycol diacrylate. Within this range, the ink jet discharge accuracy and the mold releasability can be improved.

In addition, the content of the compound of Formula (II) is preferably 2% by mass or less, more preferably 1.5% by mass or less, and still more preferably 0.5% by mass or less, with respect to the content of neopentyl glycol diacrylate. Within this range, the ink jet discharge accuracy can be improved.

Examples of a method of reducing the content of the compounds of Formulae (I) and (II) in the curable composition include a method for purifying a mixture including neopentyl glycol diacrylate, such as commercially available neopentyl glycol diacrylate, by means of separatory extraction, distillation, or silica gel column chromatography.

Examples of the distillation method include a method in which an N-oxyl compound is added to a mixture including neopentyl glycol diacrylate, such as commercially available neopentyl glycol diacrylate, followed by carrying out distillation under reduced pressure.

When carrying out distillation under reduced pressure, it is preferable to use a combination of an N-oxyl compound A having a molecular weight of 150 or more and less than 270 with an N-oxyl compound B having a molecular weight of 270 or more, as the N-oxyl compound.

By carrying out distillation using a combination of the N-oxyl compound A with the N-oxyl compound B, it is possible to produce neopentyl glycol diacrylate having a low content of impurities with good productivity while suppressing the polymerization of neopentyl glycol diacrylate during the distillation.

The mechanism by which such an effect is obtained is presumed to be as follows.

Since the N-oxyl compound A has a low molecular weight, it easily volatilizes during the distillation. Therefore, it is thought that by the addition of the N-oxyl compound A, it is possible to efficiently suppress the polymerization of neopentyl glycol diacrylate in a gas.

Since the N-oxyl compound B has a large molecular weight, it is hard to volatilize during the distillation. Therefore, it is thought that by the addition of the N-oxyl compound B, it is possible to efficiently suppress the polymerization of neopentyl glycol diacrylate in a liquid. In addition, it is difficult that the N-oxyl compound B outflows together with the vaporized neopentyl glycol diacrylate, and it is also difficult that the N-oxyl compound B is incorporated into the distillate.

Furthermore, by using the combination of the N-oxyl compound A with the N-oxyl compound B, it is possible to effectively suppress the polymerization of neopentyl glycol diacrylate in a distillation furnace, a distillation column, or the like, and thus, it is also possible to produce neopentyl glycol diacrylate having a low content of impurities with good productivity.

The N-oxyl compound A has a molecular weight of 150 or more and less than 270, preferably a molecular weight of 150 or more and less than 250, and still more preferably a molecular weight of 150 or more and less than 220.

The N-oxyl compound A is preferably a compound represented by the following Formula (A).

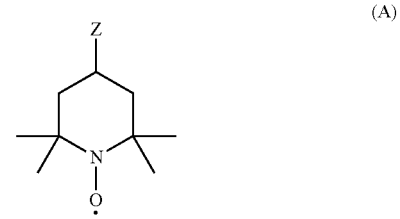

(A)

In the formula, Z represents a hydrogen atom, a hydroxyl group, an alkoxy group having 1 to 6 carbon atoms, an alkoxycarbonyl group having 2 to 4 carbon atoms, or an acyloxy group having 2 to 4 carbon atoms.

The number of carbon atoms in the alkoxy group is 1 to 6, and preferably 1 to 4.

The number of carbon atoms in the alkoxycarbonyl group is 2 to 4, and preferably 2 or 3.

The number of carbon atoms in the acyloxy group is 2 to 4, and preferably 2 or 3.

Z is preferably a hydrogen atom, a hydroxyl group, a methoxy group, or an acetoxy group.

Specific examples of the compound represented by Formula (A) include the following ones.

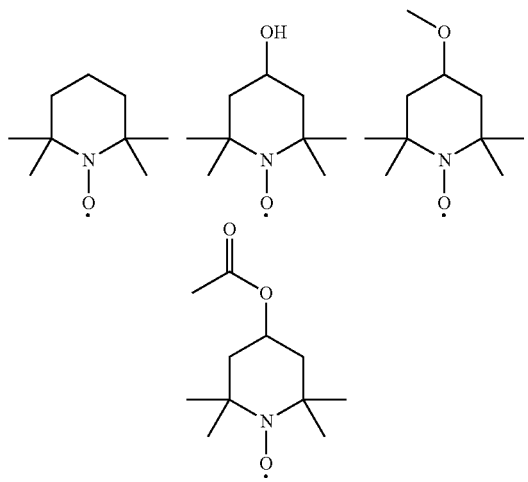

The amount of the N-oxyl compound A to be added is preferably 10 pm to 300 ppm with respect to the mass of a mixture including neopentyl glycol diacrylate. The upper limit is, for example, preferably 250 ppm or less, and more preferably 200 ppm or less. The lower limit is, for example, preferably 25 ppm or more, and more preferably 50 ppm or more. Within this range, it is possible to efficiently suppress the polymerization of neopentyl glycol diacrylate in a gas while suppressing the inflow rate of N-oxyl compound A into a distillate.

The N-oxyl compound B has a molecular weight of 270 or more, preferably a molecular weight of 270 or more and less than 500, and more preferably a molecular weight of 270 or more and less than 450.

Furthermore, the difference between the molecular weight of the N-oxyl compound B and the molecular weight of the N-oxyl compound A is preferably 20 or more, and more preferably 50 or more.

The N-oxyl compound B is preferably a compound represented by the following Formula (B).

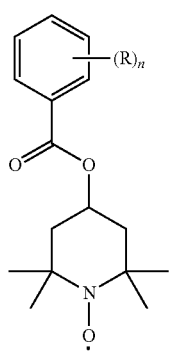

(B)

In the formula, R represents a substituent, n represents an integer of 0 to 5, and in a case where n is 2 or more, a plurality of R's may be the same as or different from each other.

Examples of the substituent include an alkyl group, an alkoxy group, and a group represented by $-NR^1R^2$.

The alkyl group may be linear, branched, or cyclic, and is preferably linear or branched. The number of carbon atoms in the alkyl group is preferably 1 to 20, more preferably 1 to 8, and still more preferably 1 to 5.

The alkoxy group may be linear, branched, or cyclic, and is preferably linear or branched. The number of carbon atoms in the alkoxy group is preferably 1 to 20, more preferably 1 to 8, and still more preferably 1 to 5.

$R^1$ and $R^2$ each independently represent a hydrogen atom or an alkyl group. The alkyl group has the same range as that described for R, and the preferred range is are also the same.

n represents an integer of 0 to 5, preferably 0 to 3, more preferably 0 to 2, and still more preferably 0 or 1.

Specific examples of the compound represented by Formula (B) include the following ones.

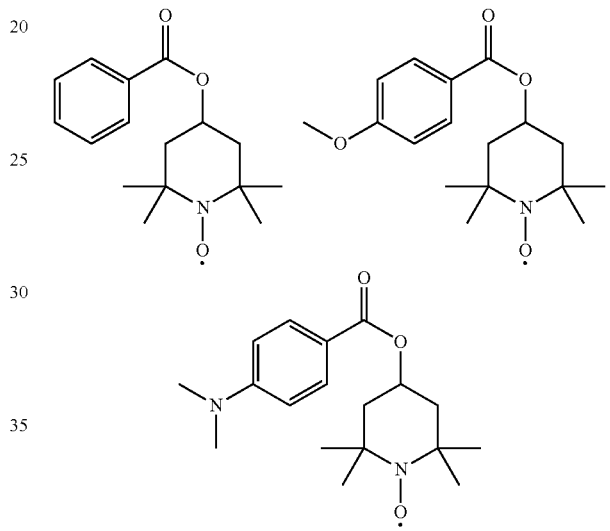

The amount of the N-oxyl compound B to be added is preferably 300 ppm or more, more preferably 500 ppm or more, and still more preferably 800 ppm or more, with respect to the mass of the mixture including neopentyl glycol diacrylate. The upper limit is not particularly limited, but from the viewpoint of cost, it is, for example, preferably 5,000 ppm or less, and more preferably 3,000 ppm or less. Within this range, it is possible to efficiently suppress the polymerization of neopentyl glycol diacrylate in a liquid.

The mixture including neopentyl glycol diacrylate is preferably subjected to separatory extraction before the addition of the N-oxyl compound. Since water-soluble impurities such as unreacted acrylic acid can be removed by carrying out the separatory extraction, neopentyl glycol diacrylate having less impurities can be obtained.

The separatory extraction can be carried out by dissolving a mixture including neopentyl glycol diacrylate in an organic solvent such as heptane, mixing the solution with water, separating the mixture into an aqueous layer and an organic layer, and recovering the organic layer. Distillation may be carried out after removing the organic solvent included in the organic layer, or distillation may also be carried out in the state where the organic layer includes the organic solvent.

Distillation can be carried out under any conditions at normal pressure, but is preferably carried out under reduced pressure.

Distillation is preferably carried out under the distillation conditions of 0.1 to 5.0 kPa and 80° C. to 180° C. The pressure is more preferably 0.1 to 1.0 kPa, and the temperature is more preferably 80° C. to 160° C.

The curable compound of the present invention can include a polymerizable compound other than neopentyl glycol diacrylate (also referred to as another polymerizable compound) as the polymerizable compound.

Examples of the polymerizable group included in such other polymerizable compounds include a group containing an ethylenically unsaturated bond, an epoxy group, and an oxetanyl group. Examples of the group containing an ethylenically unsaturated bond include a (meth)acrylate group, a (meth)acrylamido group, a vinyl group, an allyl group, and a vinyl ether group, with the (meth)acrylate group being preferable.

The number of the polymerizable groups is preferably 1 to 6, more preferably 1 to 3, and still more preferably 1 or 2.

Examples of such other polymerizable compounds include a compound having 1 to 6 groups containing ethylenically unsaturated bonds; an epoxy compound, an oxetane compound; a vinyl ether compound; a styrene derivative; propenyl ether; and butenyl ether. Specific examples of the polymerizable compound include those described in paragraph Nos. 0020 to 0098 of JP2011-231308A, the contents of which are incorporated herein. As such other polymerizable compounds, a (meth)acrylate compound is preferable.

As such other polymerizable compounds, a compound having one selected from an alicyclic hydrocarbon structure and an aromatic structure can also be preferably used. A polymerizable compound having an aromatic structure is more preferable. According to this embodiment, it is easy to form a cured film having excellent etching resistance.

A compound having 1 to 6 groups containing ethylenically unsaturated bonds (mono- to hexafunctional polymerizable compound) will be described.

Specific examples of the compound having one group containing an ethylenically unsaturated bond include methyl (meth)acrylate, ethyl (meth)acrylate, butyl (meth)acrylate, N-vinylpyrrolidinone, 2-acryloyloxyethyl phthalate, 2-acryloyloxy 2-hydroxyethyl phthalate, 2-acryloyloxyethylhexahydrophthalate, 2-acryloyloxypropyl phthalate, 2-ethyl-2-butylpropanediol acrylate, 2-ethylhexyl (meth) acrylate, 2-ethylhexylcarbitol (meth)acrylate, 2-hydroxybutyl (meth)acrylate, 2-hydroxyethyl (meth)acrylate, 2-hydroxypropyl (meth)acrylate, 4-hydroxybutyl (meth)acrylate, an acrylic acid dimer, benzyl (meth)acrylate, 1- or 2-naphthyl (meth)acrylate, butoxyethyl (meth)acrylate, cetyl (meth)acrylate, ethylene oxide-modified (hereinafter also referred to as "EO") cresol (meth)acrylate, dipropylene glycol (meth)acrylate, ethoxylated phenyl (meth)acrylate, isooctyl (meth)acrylate, cyclohexyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydipropylene glycol (meth)acrylate, methoxytripropylene glycol (meth)acrylate, methoxypolyethylene glycol (meth)acrylate, methoxytriethylene glycol (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumyl phenoxyethylene glycol (meth)acrylate, epichlorohydrin (hereinafter also referred to as "ECH")-modified phenoxyacrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol polypropylene glycol (meth)acrylate, polypropylene glycol (meth)acrylate, stearyl (meth)acrylate, EO-modified succinic (meth)acrylate, tribromophenyl (meth)acrylate, EO-modified tribromophenyl (meth)acrylate, tridodecyl (meth)acrylate, p-isopropenylphenol, N-vinylpyrrolidone, and N-vinylcaprolactam.

As the compound having one group containing an ethylenically unsaturated bond, monofunctional (meth)acrylate compounds are preferable from the viewpoint of curability. Among the monofunctional (meth)acrylate compounds, a monofunctional (meth)acrylate having an aromatic structure and/or an alicyclic hydrocarbon structure is preferable from the viewpoint of dry etching resistance, and a monofunctional (meth)acrylate having an aromatic structure is more preferable.

As a monofunctional (meth)acrylate having an aromatic structure and/or an alicyclic hydrocarbon structure, benzyl (meth)acrylate, 2-phenoxyethyl acrylate, benzyl (meth)acrylate having a substituent on the aromatic ring (preferred substituents are an alkyl group having 1 to 6 carbon atoms, an alkoxy group having 1 to 6 carbon atoms, and a cyano group), 1- or 2-naphthyl (meth)acrylate, 1- or 2-naphthylmethyl (meth)acrylate, 1- or 2-naphthylethyl (meth)acrylate, dicyclopentanyl (meth)acrylate, dicyclopentanyloxyethyl (meth)acrylate, isobornyl (meth)acrylate, or adamantyl (meth)acrylate is preferable, and 2-phenoxyethyl acrylate, benzyl (meth)acrylate, benzyl (meth)acrylate having a substituent on the aromatic ring, or a monofunctional (meth)acrylate compound having a naphthalene structure is more preferable.

Examples of the compound having two or more groups containing ethylenically unsaturated bonds include diethylene glycol monoethyl ether(meth)acrylate, dimethylol dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxypolyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic diacrylate, stearic acid-modified pentaerythritol di(meth)acrylate, ECH-modified phthalic di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethylol tricyclodecane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene urea, divinylpropylene urea, o-, m-, or p-xylylene di(meth)acrylate, 1,3-adamantane diacrylate, and norbornane dimethanol diacrylate.

Furthermore, a bi- to hexafunctional (meth)acrylate compound having an aromatic structure and/or an alicyclic hydrocarbon structure can also be used. Examples thereof include a polyfunctional (meth)acrylate compound containing an aromatic group (preferably a phenyl group or a naphthyl group) and having 2 to 4 (meth)acrylate groups. Specific examples thereof include compounds shown below.

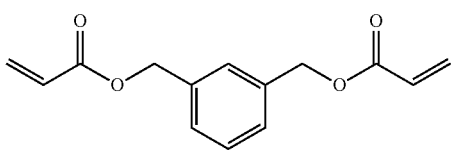

The curable composition of the present invention may contain a polymerizable compound having a silicon atom and/or a fluorine atom. The polymerizable compound having a silicon atom and/or a fluorine atom preferably includes a fluorine atom, and more preferably has a fluorine-containing alkyl group having 1 to 9 carbon atoms.

The substitution rate with fluorine atoms of the fluorine-containing alkyl group having 1 to 9 carbon atoms is preferably 40% to 100%, more preferably 50% to 90%, and more preferably 65% to 85%. The substitution rate with fluorine atoms refers to a rate (%) of an alkyl group having 1 to 9 carbon atoms, for example, in which a hydrogen atom has been substituted with a fluorine atom. The fluorine-containing alkyl group having 1 to 9 carbon atoms preferably includes —$C_nF_{2n+1}$ or —$C_nF_{2n}H$, and more preferably includes —$C_nF_{2n+1}$. Here, n represents an integer of 1 to 9, and more preferably represents an integer of 4 to 8.

As the polymerizable group that the polymerizable compound having a silicon atom and/or a fluorine atom, a (meth)acrylate group is preferable. The number of the polymerizable groups is preferably 1 or 2, and more preferably 1.

The molecular weight of the polymerizable compound having a silicon atom and/or a fluorine atom is preferably 100 to 600, and more preferably 300 to 500. For the polymerizable compound having a fluorine atom, reference can also be made to, for example, the description in paragraphs 0022 and 0023 of WO2010/137724A, the contents of which are incorporated herein. Examples of the polymerizable compound having a fluorine atom include 2-(perfluorohexyl)ethyl acrylate. Examples of the commercially available product thereof include CHEMINOX (registered trademark), and FAAC-6 (manufactured by Unimatec Co., Ltd.).

Moreover, in the present invention, an embodiment which substantially does not include a polymerizable compound having a silicon atom and/or a fluorine atom is also available. Substantially not including a polymerizable compound having a silicon atom and/or a fluorine atom means, for example, that the content of the polymerizable compound having a silicon atom and/or a fluorine atom in the components of all the polymerizable compounds is preferably 1% by mass or less, more preferably 0.5% by mass or less, and still more preferably 0.1% by mass or less, and even still more preferably, the polymerizable compound is not included.

The total amount of the polymerizable compounds having one polymerizable group in the components of all the polymerizable compounds included in the curable composition is preferably 0% to 60% by mass with respect to all the polymerizable compounds. The lower limit is, for example, more preferably 5% by mass or more, and still more preferably 15% by mass or more. The upper limit is more preferably 50% by mass or less, and still more preferably 40% by mass or less.

Furthermore, the total amount of the polymerizable compounds having two polymerizable groups is preferably 40% to 100% by mass with respect to all the polymerizable compounds. The lower limit is, for example, more preferably at least 50% by mass, and still more preferably at least 60% by mass. The upper limit is more preferably 95% by mass or less, and still more preferably 85% by mass or less.

The total amount of the polymerizable compounds having an alicyclic hydrocarbon structure and/or an aromatic structure in the components of all the polymerizable compounds included in the curable composition is preferably 10% to 90% by mass with respect to all the polymerizable compounds. The lower limit is, for example, more preferably 30% by mass or more, and still more preferably 50% by mass or more. The upper limit is more preferably 85% by mass or less, and still more preferably 80% by mass or less.

<<Photopolymerization Initiator>>

As the photopolymerization initiator, any compound that generates active species capable of polymerizing the polymerizable compounds described above by irradiation with light can be used. As the photopolymerization initiator, a radical polymerization initiator and a cationic polymerization initiator are preferable, and a radical polymerization initiator is more preferable. Further, in the present invention, a plurality of photopolymerization initiators may be used in combination.

As the radical photopolymerization initiator, for example, commercially available initiators can be used. As an example thereof, one described in paragraph 0091 of JP2008-105414A can be preferably selected. Among these, an acetophenone-based compound, an acylphosphine oxide-based compound, and an oxime ester-based compound are preferable from the viewpoints of curing sensitivity and absorption characteristics. Examples of the commercially available product include IRGACURE (registered mark) OXE-01, IRGACURE OXE-02, IRGACURE 127, IRGACURE 819, IRGACURE 379, IRGACURE 369, IRGACURE 754, IRGACURE 1800, IRGACURE 651, IRGACURE 907, LUCIRIN (registered mark) TPO, and IRGACURE 1173 (all manufactured by BASF).

The content of the photopolymerization initiator is preferably 0.01% to 15% by mass, more preferably 0.1% to 12% by mass, and still more preferably 0.2% to 7% by mass, with respect to the entire composition excluding the solvent. The curable composition may include only one kind of photopolymerization initiator, or may include two or more kinds of photopolymerization initiators. In a case of including two or more kinds of photopolymerization initiators, the total amount thereof preferably falls within the range.

<<Polymerization Inhibitor>>

The curable composition of the present invention preferably contains a polymerization inhibitor. The content of the polymerization inhibitor is 0.001% to 0.1%, more preferably 0.005% to 0.08% by mass, and still more preferably 0.01% to 0.05% by mass, with respect to the mass of all the polymerizable compounds. By blending an appropriate amount of the polymerization inhibitor, a change in the viscosity over age can be suppressed in a state of keeping a high level of curing sensitivity. Examples of the polymerization inhibitor include the N-oxyl compound described above. Specific examples of the N-oxyl compound include a 4-hydroxy-2,2,6,6-tetramethylpiperidin-1-oxyl-free radical. Further, other specific examples of the polymerization inhibitor include those described in paragraph No. 0121 of JP2012-169462A, the contents of which are incorporated herein.

<<Surfactant>>

The curable composition can contain a surfactant. As the surfactant, a non-ionic surfactant is preferable.

The nonionic surfactant is a compound which has at least one hydrophobic part and at least one nonionic hydrophilic portion. The hydrophobic portion and the hydrophilic portion may each be at the terminal of a molecule or inside the molecule. The hydrophobic portion is constituted with a hydrophobic group selected from a hydrocarbon group, a fluorine-containing group, and an Si-containing group, and the number of carbon atoms in the hydrophobic portion is preferably 1 to 25, more preferably 2 to 15, still more preferably 4 to 10, and the most preferably 5 to 8. The nonionic hydrophilic portion preferably has at least one group selected from the group consisting of an alcoholic hydroxyl group, a phenolic hydroxyl group, an ether group (preferably a polyoxyalkylene group or a cyclic ether group), an amido group, an imido group, a ureido group, a urethane group, a cyano group, a sulfonamido group, a lactone group, a lactam group, and a cyclocarbonate group. The nonionic surfactant may be any one nonionic surfactant of a hydrocarbon-based surfactant, a fluorine-based surfactant, an Si-based surfactant, and a fluorine/Si-based surfactant, and it is preferably a fluorine-based surfactant or an Si-based surfactant, and more preferably a fluorine-based surfactant. Here, the "fluorine/Si-based surfactant" refers to one satisfying both the requirements for a fluorine-based surfactant and an Si-based surfactant.

Examples of the commercially available product of the fluorine-based nonionic surfactant include FLUORAD (registered mark) FC-4430 and FC-4431, manufactured by Sumitomo 3M Limited, SURFLON (registered mark) S-241, S-242, and S-243, manufactured by Asahi Glass Co., Ltd., EFTO (registered mark) EF-PN31M-03, EF-PN31M-04, EF-PN31M-05, EF-PN31M-06, and MF-100, manufactured by Mitsubishi Materials Electronic Chemicals Co., Ltd., POLYFOX PF-636, PF-6320, PF-656, and PF-6520, manufactured by OMNOVA Solutions, Inc., FTERGENT (registered mark) 250, 251, 222F, and 212M DFX-18, manufactured by NEOS Co., Ltd., UNIDYNE (registered mark) DS-401, DS-403, DS-406, DS-451, and DSN-403N, manufactured by Daikin Industry Co., Ltd., MEGAFACE (registered mark) F-430, F-444, F-477, F-553, F-556, F-557, F-559, F-562, F-565, F-567, F-569, and R-40, manufactured by DIC Corporation, and CAPSTONE (registered mark) FS-3100, and ZONYL FSO-100 manufactured by Dupont.

In a case where the curable composition of the present invention contains a surfactant, the content of the surfactant is preferably 0.1% to 10% by mass, more preferably 0.2% to 5% by mass, and still more preferably 0.5% to 5% by mass, with respect to the entire composition excluding the solvent. The curable composition may include only one kind of surfactant, or may include two or more kinds of surfactants. In a case of including two or more kinds of surfactants, the total amount thereof preferably falls within the range.

Moreover, in the present invention, an embodiment which substantially does not include a surfactant is also available. Substantially not including a surfactant means, for example, that the content of the surfactant is preferably 0.01% by mass or less, and more preferably 0.005% by mass or less, and still more preferably, the surfactant is not included.

<<Non-Polymerizable Compound>>

The curable composition may include a non-polymerizable compound which has a polyalkylene glycol structure having, at the terminal thereof, at least one hydroxyl group or an etherified hydroxyl group, and substantially does not contain a fluorine atom and a silicon atom. Here, the non-polymerizable compound refers to a compound not having a polymerizable group. Further, substantially not containing a fluorine atom and a silicon atom denotes, for example, that the total content of the fluorine atoms and the silicon atoms is 1% or less, and preferably denotes that there is neither a fluorine atom nor a silicon atom. By inclusion of neither fluorine atom nor silicon atom, the compatibility with a polymerizable compound is improved, and in particular, in a composition not containing a solvent, the coating uniformity, the pattern formability during an imprint, and the line edge roughness after drying etching are improved.

The polyalkylene structure included in the non-polymerizable compound is preferably a polyalkylene glycol structure containing an alkylene group having 1 to 6 carbon atoms, more preferably a polyethylene glycol structure, a polypropylene glycol structure, a polybutylene glycol structure, or a mixed structure thereof, still more preferably a polyethylene glycol structure, a polypropylene glycol structure, or a mixed structure thereof, and particularly preferably a polypropylene glycol structure.

Moreover, the non-polymerizable compound may be constituted substantially only with a polyalkylene glycol structure, excluding a terminal substituent. Here, "substantially" means that the content of the constituents other than the polyalkylene glycol structure is 5% by mass or less, and preferably 1% by mass or less, of all the constituents. In particular, it is particularly preferable that a compound constituted substantially only with a polypropylene glycol structure is included as the non-polymerizable compound.

The polyalkylene glycol structure preferably has 3 to 100 alkylene glycol constructional units, more preferably 4 to 50 alkylene glycol constructional units, still more preferably 5 to 30 alkylene glycol constructional units, and the most preferably 6 to 20 alkylene glycol constructional units.

The non-polymerizable compound preferably has, at the terminal thereof, at least one hydroxyl group or an etherified hydroxyl group. If the non-polymerizable compound has, at the terminal thereof, at least one hydroxyl group or an etherified hydroxyl group, any of the non-polymerizable compounds in which the residual terminals are hydroxyl groups or a hydrogen atom of the terminal hydroxyl group is substituted may also be used. As the group in which a hydrogen atom of the terminal hydroxyl group may be substituted, an alkyl group (that is, a polyalkylene glycol alkyl ether) or an acyl group (that is, a polyalkylene glycol ester) is preferable, and polyalkylene glycol which has hydroxyl groups at all terminals is more preferable. Although a compound having a plurality of (preferably 2 or 3) polyalkylene glycol chains each bonded via a linking group can also be preferably used, those having a linear structure in which the polyalkylene glycol chain is not branched are preferable. In particular, a diol-type polyalkylene glycol is preferable.

Specific preferred examples of the non-polymerizable compound include polyethylene glycol, polypropylene glycol, mono- or dimethyl ether thereof, mono- or dibutyl ether, mono- or dioctyl ether, mono- or dicetyl ether, monostearic acid ester, monooleic acid ester, polyoxyethylene glyceryl ether, polyoxypropylene glyceryl ether, and trimethyl ether thereof.

The weight-average molecular weight of the non-polymerizable compound is preferably 150 to 6,000, more preferably 200 to 3,000, still more preferably 250 to 2,000, and even still more preferably 300 to 1,200.

In a case where the curable composition of the present invention contains a non-polymerizable compound, the content of the non-polymerizable compound is preferably 0.1% to 20% by mass, more preferably 0.2% to 15% by mass, and still more preferably 0.5% to 10% by mass, with respect to the entire composition excluding the solvent. Further, in the present invention, an embodiment in which the non-polymerizable compound is not substantially contained is also available. Substantially not containing a non-polymerizable compound means, for example, that the content of the non-polymerizable compound is preferably 0.01% by mass or less, and more preferably 0.005% by mass or less and still more preferably, the non-polymerizable compound is not contained.

An embodiment in which the curable composition of the present invention substantially does not include a polymer component other than the non-polymerizable compound is also available.

<<Solvent>>

The curable composition of the present invention may contain a solvent. The content of the solvent in the curable composition of the present invention is preferably 5% by mass or less, and more preferably 3% by mass or less, and particularly preferably, a solvent is not substantially contained. Here, substantially not containing a solvent means that, for example, the content of the solvent is 1% by mass or less with respect to the total mass of the curable composition of the present invention.

In a case where the curable composition of the present invention is coated on a substrate by an ink jet method, a small blend amount of the solvent preferably makes it possible to suppress the change in viscosity of the composition due to volatilization of the solvent.

Although the curable composition of the present invention does not always include a solvent, the solvent may be added arbitrarily at a time of finely controlling the viscosity of composition, or other cases. The type of a solvent that can be preferably used for the curable composition of the present invention is not particularly limited as long as it is a solvent that is generally used for curable composition for photoimprints and photoresists, and may be any solvent capable of allowing therein uniformly dissolving or dispersing the compound used in the present invention, and doing not react with these components. Examples of the solvent that can be used in the present invention include those described in paragraph No. 0088 of JP2008-105414A, the contents of which are incorporated herein.

<<Other Components>>

The curable composition may optionally include, other than the components described above, a photosensitizer, an antioxidant, an ultraviolet absorber, a photostabilizer, an age resistor, a plasticizer, an adherence modifier, a thermal polymerization initiator, a photobase generator, a colorant, inorganic particles, elastomer particles, a basic compound, a photoacid generator, a photoacid amplifier, a chain transfer agent, an antistatic agent, a fluidity modifier, an anti-foaming agent, a dispersant, and a release agent. Specific examples of these components include those described in paragraph Nos. 0092 and 0093, and paragraph Nos. 0099 to 0137 of JP2008-105414A, the contents of which are incorporated herein. Further, reference can be made to the pamphlets of WO2011/126101A and WO2013/051735A, and descriptions corresponding to JP2012-041521A and JP2013-093552A, contents of which are incorporated herein.

<Preparation Method and Use of Curable Composition>

The curable composition of the present invention can be prepared by mixing the respective components described above. The mixing of the respective components is usually carried out in a range of 0° C. to 100° C. Further, after mixing the respective components, the mixture is preferably filtered through, for example, a filter. The filtration may be carried out in multiple steps or may be repeated plural times. In addition, the filtered liquid may also be refiltered.

Any filter which has been used in the filtration applications from the related art can be used without particular limitation. Examples of the filter include fluorine resins such as polytetrafluoroethylene (PTFE), polyamide-based resins such as nylon-6 and nylon 6,6, and polyolefin resins (including a high-density polyolefin and an ultrahigh-molecular weight polyolefin) such as polyethylene and polypropylene (PP). Among these materials, polypropylene (including a high-density polypropylene) and nylon are preferable.

The pore diameter of the filter is suitably, for example, approximately 0.003 to 5.0 μm. By setting the pore diameter to fall within the range, it is possible to reliably remove impurities and aggregates included in the composition, while suppressing filtration clogging.

When using a filter, different filters may be combined. At this time, the filtration with the first filter may be performed once or may also be performed twice or more times. In a case of performing filtration twice or more tomes through a combination of different filters, the pore diameter at the second run or later is preferably the same as or smaller than that of the first filtration run. Further, the first filter having different pore diameters may be combined within the above-mentioned range. For the pore diameter as mentioned herein, reference can be made to a nominal value of a filter maker. As a commercially available filter, a filter can be selected from various filters provided by, for example, Nihon Pall Ltd., Advantec Toyo Kaisha, Ltd., Nihon Entegris K. K, Nihon Mykrolis Ltd., and Kitz Micro Filter Corporation.

The viscosity of the curable composition is preferably 15 mPa·s or less, more preferably 12 mPa·s or less, still more preferably 11 mPa·s or less, and particularly preferably 10.3 mPa·s or less, at 23° C. The lower limit is not particularly limited, but can be set to, for example, 3 mPa·s or more, or to 5 mPa·s or more. By setting the viscosity to fall within the range, it is possible to improve ink jet discharge accuracy and pattern formability.

Moreover, in a permanent film (resist for a structural member) used in a liquid crystal display (LCD) or the like, or a resist used in substrate processing of an electronic material, it is preferable to definitely avoid incorporation of ionic impurities such as metals and organic materials in order not to inhibit the operation of a product. Therefore, in a case of using a pattern product to the applications described above, it is favorable that the concentration of the ionic impurities of metals or organic materials in the photocurable composition is 1 ppm or less, preferably 100 ppb or less, and more preferably 10 ppb or less.

<Pattern Forming Method>

Hereinafter, a pattern forming method (pattern transfer method) using the curable composition of the present invention will be described in detail. In the pattern forming method of the present invention, first, the curable composition of the present invention is coated on a base material or a mold having a pattern, and the curable composition of the present invention is then irradiated with light in a state of keeping the composition sandwiched between the mold and the base material.

By using generally known coating methods such as a dip coating method, an air knife coating method, a curtain coating method, a wire bar coating method, a gravure coating method, an extrusion coating method, a spin coating method, a slit scan coating method, and an ink jet method as a method for coating the curable composition of the present invention on the base material, a coated film or liquid droplets can be arranged on the base material. In particular, since the curable composition of the present invention has excellent ink jet discharge accuracy, it is preferably applied by an ink jet method.

When the curable composition of the present invention is sandwiched between the mold and the base material, a helium gas may be introduced between the mold and the base material. By using such a method to promote the transmission of a gas through a quartz mold, the loss of residual bubbles can be promoted. Further, by reducing the dissolved oxygen in the curable composition, it is possible to suppress the inhibition of radical polymerization in the exposure. In addition, a condensable gas instead of helium may be introduced between the mold and the base material. By using such a method, the introduced condensable gas is condensed and its volume is reduced, through which the disappearance of the remaining bubbles can further be promoted. The condensable gas refers to a gas that is condensed depending on a temperature and a pressure, and trichlorofluoromethane and 1,1,1,3,3-pentafluoropropane, for example, can be used. For the condensable gas, reference can be made to, for example, the descriptions of paragraph 0023 of JP2004-103817A and paragraph 0003 of JP2013-254783A, the contents of which are incorporated herein.

During the exposure, the exposure illuminance is preferably set to a range from 1 to 200 mW/cm$^2$. By setting the illuminance to 1 mW/cm$^2$ or more, the exposure time can be shortened, and thus, the productivity is improved, while by setting the illuminance to 200 mW/cm$^2$ or less, there is a tendency that deterioration of the characteristics of the cured film due to occurrence of side reactions can be suppressed, which is thus preferable. The exposure dose is preferably set to a range from 5 to 1,000 mJ/cm$^2$.

During the exposure, in order to suppress the inhibition of radical polymerization due to oxygen, it is preferable to introduce an inert gas such as oxygen, nitrogen, helium, argon, and carbon dioxide so as to control the oxygen concentration in the atmosphere to 10 kPa or less. More preferably, the oxygen concentration in the atmosphere is 3 kPa or less, and more preferably 1 kPa or less.

In the pattern forming method of the present invention, a pattern forming layer (a layer composed of the curable composition of the present invention) may be subjected to curing by irradiation with light, followed by, as necessary, applying heat to the cured pattern to further performing curing. The heat for heating and curing the curable composition of the present invention after irradiation with light has a temperature of preferably 150° C. to 280° C., and more preferably 200° C. to 250° C. Further, the time for applying heat is preferably 5 to 60 minutes, and more preferably 15 to 45 minutes.

Specific examples of the pattern forming method include those described in paragraph Nos. 0125 to 0136 of JP2012-169462A, the contents of which are incorporated herein.

The pattern forming method of the present invention can be applied as a pattern reversal method. Specifically, the method is as follows. A resist pattern is formed on a substrate to be processed, which includes a carbon film (SOC), by the pattern forming method of the present invention. Next, after coating the resist pattern with an Si-containing film (SOG), an upper portion of the Si-containing film is etched back to expose the resist pattern, and the exposed resist pattern is removed by oxygen plasma or the like to form a reversal pattern of the Si-containing film. Further, with the reversal pattern of the Si-containing film as an etching mask, the carbon film on the underlayer thereof is etched such that the reversal pattern is transferred onto the carbon film. Finally, with the carbon film onto which the reversal pattern has been transferred, the base material is etching-processed. For examples of such a method, reference can be made to JP1993-267253A (JP-H05-267253A), JP2002-110510A, and paragraphs 0016 to 0030 of JP2006-521702A, the contents of which are incorporated herein.

The pattern forming method of the present invention may include a step of coating an underlayer film composition on a base material to form an underlayer film, a step for coating the curable composition of the present invention on the surface of the underlayer film, a step of irradiating the curable composition of the present invention and the underlayer film with light in a state of keeping them sandwiched between the base material and the mold having a pattern, a step of curing the curable composition of the present invention, and a step of peeling the mold. In addition, after coating the underlayer film composition on the base material, a part of the underlayer film composition may be cured by heat or irradiation with light, and then the curable composition of the present invention may be coated thereon.

The underlayer film composition includes, for example, a curable main agent. The curable main agent may be thermally curable or photocurable, but is preferably thermally curable. The curable main agent preferably has a molecular weight of 400 or more, and it may be a low molecular compound or a polymer, but is preferably the polymer. The molecular weight of the curable main agent is preferably 500 or more, more preferably 1,000 or more, and still more preferably 3,000 or more. The upper limit of the molecular weight is preferably 200,000 or less, more preferably 100,000 or less, and still more preferably 50,000 or less. By setting the molecular weight to 400 or more, volatilization of the components can be more effectively suppressed. As the curable main agent, for example, a polymer having a constructional unit represented by the following general formula as a main component can be used.

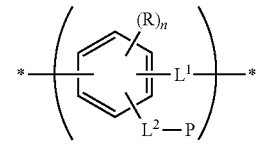

In the general formula, R is an alkyl group, $L^1$ and $L^2$ are each a divalent linking group, P is a polymerizable group, and n is an integer of 0 to 3.

R is preferably an alkyl group having 1 to 5 carbon atoms group, and more preferably a methyl group.

$L^1$ is preferably an alkylene group, more preferably an alkylene group having 1 to 3 carbon atoms, and still more preferably —CH$_2$—.

$L^2$ is —CH$_2$—, —O—, —CHR (R is a substituent)-, and a divalent linking group formed by combination of two or more of these groups. R is preferably an OH group.

P is preferably a (meth)acryloyl group, and more preferably an acryloyl group.

n is preferably an integer of 0 to 2, and more preferably 0 or 1.

Examples of a commercially available product thereof include NK OLIGO EA-7140/PGMAc (manufactured by Shin-Nakamura Chemical Co., Ltd.). Other examples include those described in paragraph Nos. 0040 to 0056 of JP2009-503139A, the contents of which are incorporated therein.

The content of the curable main agent is preferably 30% by mass or more, more preferably 50% by mass or more, and still more preferably 70% by mass or more, of all the components excluding the solvent. Two or more kinds of the curable main agents may be used, and in this case, the total content thereof preferably falls within the range.

The underlayer film composition preferably contains a solvent. A preferable solvent is a solvent having a boiling point of 80° C. to 200° C. at normal pressure. Regarding the kind of the solvent, any solvent that can dissolve the underlayer film composition therein can be used, but is preferably a solvent having only one or more of an ester structure, a ketone structure, a hydroxyl group, and an ether structure. Specifically, preferred solvents are a singular solvent or mixed solvent selected from propylene glycol monomethyl ether acetate, cyclohexanone, 2-heptanone, gamma-butyrolactone, propylene glycol monomethyl ether, and ethyl lactate, and a solvent containing propylene glycol monomethyl ether acetate is particularly preferable from the viewpoint of coating uniformity.

The content of the solvent in the underlayer film composition is optimally adjusted depending on the viscosity of the components excluding the solvent, coatability, and a desired thickness. From the viewpoint of improving the coatability, the solvent can be added in an amount in a range of 70% by mass or more, preferably 90% by mass or more, more preferably 95% by mass or more, and still more preferably 99% by mass or more, of the entire composition.

The underlayer film composition may contain, as other components, at least one of a surfactant, a thermal polymerization initiator, a polymerization inhibitor, or a catalyst. The blend amount of these other components is preferably 50% by mass or less with respect to all the components excluding the solvent.

The underlayer film composition can be prepared by mixing the respective components described above. After mixing the respective components described above, the mixture is preferably filtered, for example, through a filter having a pore diameter of 0.003 μm to 5.0 μm. Filtration may be carried out in multiple steps or may be repeated plural times. Further, the filtered liquid can also be refiltered. Examples of the filter include those described in the preparation of the curable composition described above.

The underlayer film composition is coated on a base material to form an underlayer film. A coated film or liquid droplets can be arranged on the base material by using a generally known coating method such as a dip coating method, an air knife coating method, a curtain coating method, a wire bar coating method, a gravure coating method, an extrusion coating method, a spin coating method, a slit scan coating method, and an ink jet method as a method for coating the underlayer film composition on the base material. From the viewpoint of the uniformity of film thickness, the spin coating method is more preferable. Thereafter, the solvent is dried. A preferred drying temperature is 70° C. to 130° C. Preferably, the film is further cured using active energy (preferably heat and/or light). Preferably, curing under heating is carried out at a temperature of 150° C. to 250° C. The step of drying the solvent and the step of curing may be carried out at the same time. As described above, it is preferable that the underlayer film composition is coated, followed by curing of a part of the underlayer film composition under heating or irradiation with light, and then the curable composition of the present invention is coated. If such a means is adopted and used, there is tendency that during the photocuring of the curable composition of the present invention, the underlayer film composition is completely cured, and the adhesiveness is further improved.

The film thickness of the underlayer film varies depending on the applications in which the underlayer film is used, but is approximately 0.1 nm to 100 nm, preferably 1 to 20 nm, and more preferably 2 to 10 nm. Further, the underlayer film composition may be coated by multiple coating. The obtained underlayer film is preferably as flat as possible.

The base material (a substrate or a support) can be selected depending of various applications, and examples thereof include, but not particularly limited to, quartz, glass, an optical film, a ceramic material, a deposited film, a magnetic film, a reflective film, a metal base material with Ni, Cu, Cr, Fe, or the like, paper, Spin On Glass (SOG), a polymer base material such as a polyester film, a polycarbonate film, and a polyimide film, a TFT array base material, an electrode panel of PDP, a glass or translucent plastic base material, an electrically conductive base material with ITO, a metal, or the like, an insulating base material, and an semiconductor manufacturing base material with silicon, silicon nitride, polysilicon, silicon oxide, amorphous silicon, or the like. However, in a case where the base material is used in applications for etching as described below, it is preferably a base material for manufacturing a semiconductor device.

<Pattern>

The pattern formed by the pattern forming method of the present invention as described above may be used as a permanent film (a resist for a structural member) used for a liquid crystal display or the like, or as an etching resist.

The pattern can be preferably used, for example, for manufacture of a semiconductor integrated circuit, a flat screen, a microelectromechanical system (MEMS), a sensor element, an optical disk, a magnetic recording medium such as a high-density memory disk, optical components such as a grating and a relief hologram, a nanodevice, an optical device, an optical film or polarizing element for manufacturing a flat panel display, a thin-film transistor used for a liquid crystal display device, an organic transistor, a color filter, an overcoat layer, a pillar material, a rib member for aligning liquid crystals, a microlens array, an immunoassay chip, a DNA separation chip, a microreactor, a nanobio device, an optical waveguide, an optical filter, and a photonic liquid crystal.

<Method for Manufacturing Device>

The method for manufacturing a device of the present invention includes the pattern forming method described above.

That is, a device can be manufactured by forming a pattern by the method described above, and then applying a method used for the manufacture of various devices thereto.

The pattern may also be included as a permanent film in the device. Further, using the pattern as an etching mask, a base material can also be subjected to an etching treatment. For example, dry etching is carried out with the pattern as the etching mask, and the upper layer portion of the base material is selectively removed. By repeatedly subjecting the base material to such a treatment, a device can also be manufactured. Examples of the device include semiconductor devices such as a large scale integrated circuit (LSI).

EXAMPLES

Hereinafter, the present invention will be described in more detail with reference to Examples. The materials, the amounts to be used, the ratios, the details of treatments, the procedures of treatments, and the like shown in Examples below may be appropriately modified while not departing from the spirit of the present invention. Therefore, the scope of the present invention is not limited to specific examples shown below. Further, unless otherwise specified, "%" is based on mass.

Sample Preparation Example 1

To 100 g of "NK ESTER A-NPG" manufactured by Shin-Nakamura Chemical Co., Ltd., which is a neopentyl glycol diacrylate mixture, was added 100 mL of heptane, and the mixture was subjected to separatory extraction with 100 mL of pure water. To the organic layer were added 10 mg (100 ppm) of 4-hydroxy-2,2,6,6-tetramethylpiperidine 1-oxyl (4-HO-TEMPO, manufactured by Tokyo Chemical Industry Co., Ltd.) and 100 mg (1000 ppm) of 4-benzoyloxy-2,2,6,6-tetramethylpiperidine 1-oxyl (4-BzO-TEMPO, manufactured by Wako Pure Chemical Industries, Ltd.). The mixture was concentrated under reduced pressure and then distilled under reduced pressure at 0.67 kPa, thereby obtaining a very pale orange liquid A (a boiling point of 109° C., a yield amount of 77 g, and a yield rate of 77%).

From gas chromatographic analysis, the liquid A was identified as follows. The content of neopentyl glycol diacrylate (NPGDA) was 99.2%, the content of the compound of Formula (I) and the compound of Formula (II) was the lower limit of quantification or less, and the content of the compound of Formula (III) was 0.7%. In addition, the content of 4-HO-TEMPO was 59 ppm, and the content of Na was 1 ppb or less. The viscosity was 4.5 mPa·s at 25° C.

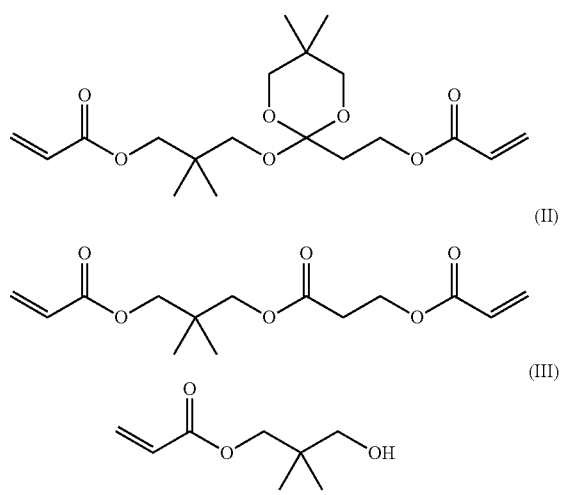

Sample Preparation Example 2

To 100 g of "LIGHT ACRYLATE NP-A" manufactured by Kyoeisha Chemical Co., Ltd., which is a neopentyl glycol diacrylate mixture, were added 10 mg (100 ppm) of 4-HO-TEMPO and 100 mg (1,000 ppm) of 4-BzO-TEMPO, and the mixture was concentrated under reduced pressure and then distilled under reduced pressure at 0.67 kPa, thereby obtaining a very pale orange liquid B (a boiling point of 108° C., a yield amount of 74 g, and a yield rate of 74%).

From gas chromatographic analysis, the liquid B was identified as follows. The content of NPGDA was 98.5%, the content of the compound of Formula (I) and the compound of Formula (II) was the lower limit of quantification or less, and the content of the compound of Formula (III) was 1.5%. In addition, the content of 4-HO-TEMPO was 55 ppm, and the content of Na was 1 ppb or less. The viscosity was 4.5 mPa·s at 25° C.

Sample Preparation Example 3

21 g of the residues in the flask after the purification by distillation in Example 2 was purified by silica gel column chromatography (developing solvent: hexane/ethyl acetate=75/25) to isolate 3.9 g of the compound of Formula (I) and 2.6 g of the compound of Formula (II). The viscosity of the compound of Formula (I) was 35.0 mPa·s at 25° C. Further, the viscosity of the compound of Formula (II) was 23.4 mPa·s at 25° C.

Sample Preparation Example 4

From gas chromatographic analysis, "NK ESTER A-NPG" manufactured by Shin-Nakamura Chemical Co., Ltd. was identified as follows. The content of NPGDA was 90.0%, the content of the compound of Formula (I) was 7.4%, the content of the compound of Formula (II) was 1.5%, and the content of the compound of Formula (III) was 0.7%. The viscosity was 5.6 mPa·s at 25° C.

Sample Preparation Example 5

From gas chromatographic analysis, "LIGHT ACRYLATE NP-A" manufactured by Kyoeisha Chemical Co., Ltd. was identified as follows. The content of NPGDA was 89.8%, the content of the compound of Formula (I) was 6.4%, the content of the compound of Formula (II) was 1.5%, and the content of the compound of Formula (III) was 1.8%. Further, 2,500 ppb of Na was found. The viscosity was 5.5 mPa·s at 25° C.

Sample Preparation Example 6

From gas chromatographic analysis, a Sigma-Aldrich reagent (catalog number) was identified as follows. The content of NPGDA was 79.6%, the content of the compound of Formula (I) was 9.0%, the content of the compound of Formula (II) was 8.4%, and the content of the compound of Formula (III) was 1.2%. The viscosity was 7.0 mPa·s at 25° C.

<Measurement Conditions for Gas Chromatography>

The contents of NPGDA, the compound of formula (I), the compound of Formula (II), and the compound of formula (III) in each sample were measured under the following conditions, from gas chromatographic analysis. The content of each compound was determined from a peak area ratio.

Equipment: 7890A manufactured by Agilent Technologies, Inc.

Column: HP-5, Part number 19091J-413 (inner diameter 0.32 mmφ, length 30 m, thickness 0.25 μm), manufactured by Agilent Technologies, Inc.

Column temperature: 50° C.→5° C./minute→150° C.→10° C./min→250° C. (5-minute retention)

Inlet temperature: 250° C.

Detector: Hydrogen flame ionization detector (FID)

Detector temperature: 250° C.

Carrier gas: Helium

Sample concentration: 1 mg/mL (acetone)

Injection volume: 1 μL

Split ratio: 1:10

<Measurement of Viscosity>

Using an E type viscometer (RE85L manufactured by Told Sangyo Co., Ltd.), the viscosity was measured at 25° C.

<Measurement of Na Content>

Using 7500 cs manufactured by Agilent Technologies, Inc., the Na content was measured by inductively coupled plasma mass spectrometry (ICP-MS).

TABLE 1

| | Sample Preparation Example 1 Liquid A | Sample Preparation Example 2 Liquid B | Sample Preparation Example 4 NK ESTER A-NPG | Sample Preparation Example 5 LIGHT ACRYLATE NP-A | Sample Preparation Example 6 Aldrich sample |
|---|---|---|---|---|---|
| NPGDA (%) | 99.2 | 98.5 | 90.0 | 89.8 | 79.6 |
| Compound of Formula (I) (%) | nd | nd | 7.4 | 6.4 | 9.0 |
| Compound of Formula (II) (%) | nd | nd | 1.5 | 1.5 | 8.4 |
| Compound of Formula (III) (%) | 0.7 | 1.5 | 0.7 | 1.8 | 1.2 |
| Viscosity at 25° C. (mPa · s) | 4.5 | 4.5 | 5.6 | 5.5 | 7.0 |

In the table, "nd" represents the lower limit of quantification or less, that is, 0.1% or less.

<Preparation of Curable Compound>

At the mass ratios shown in Tables 2 and 3, the polymerizable compound, the photopolymerization initiator, and the non-polymerizable compound were mixed. Further, 4-HO-TEMPO as the polymerization inhibitor was added in an amount of 200 ppm (0.02% by mass) with respect to the curable composition. The mixture was filtered through a 0.1 μm PTFE-made filter to prepare a curable composition. The viscosity at 23° C. of the prepared curable composition was measured using an E type viscometer RE85L (Toki Sangyo Co., Ltd.).

<Polymerizable Compound (A)>

A-1: m-Xylylene bisacrylate (synthesized from α,α'-dichloro-m-xylene and acrylic acid)

A-2: LIGHT ACRYLATE 3EG-A (manufactured by Kyoeisha Chemical Co., Ltd.)

A-3: CHEMINOX made (registered trademark) FAAC-6 (manufactured by Unimatec Co., Ltd.)

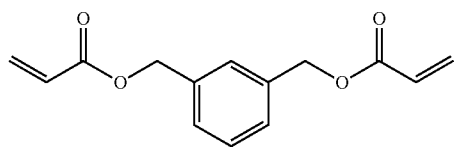 [SMILES: C=CC(=O)OCc1cccc(COC(=O)C=C)c1]

A-1

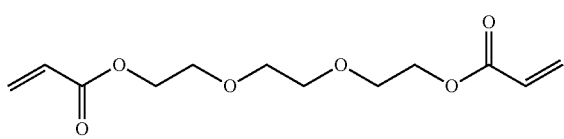

A-2

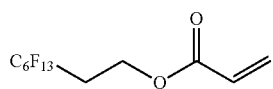

A-3

A-NPG: "NK ESTER A-NPG" manufactured by Shin-Nakamura Chemical Co., Ltd. (liquid of Sample Preparation Example 4)

NP-A: "LIGHT ACRYLATE NP-A" manufactured by Kyoeisha Chemical Co., Ltd. (liquid of Sample Preparation Example 5)

Liquid A: Liquid A of Sample Preparation Example 1

Compound of Formula (I): Compound of Formula (I) obtained in Sample Preparation Example 3

Compound of Formula (II): Compound of Formula (II) obtained in Sample Preparation Example 3

<Photopolymerization Initiator (B)>

B-1: IRGACURE (registered mark) 819 (manufactured by BASF)

B-2: IRGACURE (registered mark) 1173 (manufactured by BASF)

<Non-Polymerizable Compound (C)>

C: Polypropylene glycol (number-average molecular weight of 700, manufactured by Wako Pure Chemical Industries, Ltd.)

<Preparation of Underlayer Film Composition>

3 g of NK OLIGO EA-7140/PGMAc (manufactured by Shin-Nakamura Chemical Co., Ltd., the following structure (average m+n=4, average n/(m+n)=0.5), a solid content of 70% by mass) was dissolved into 997 g of propylene glycol monomethyl ether acetate, and the mixture was filtered through a 0.1 μm-tetrafluoroethylene filter to obtain an underlayer film composition.

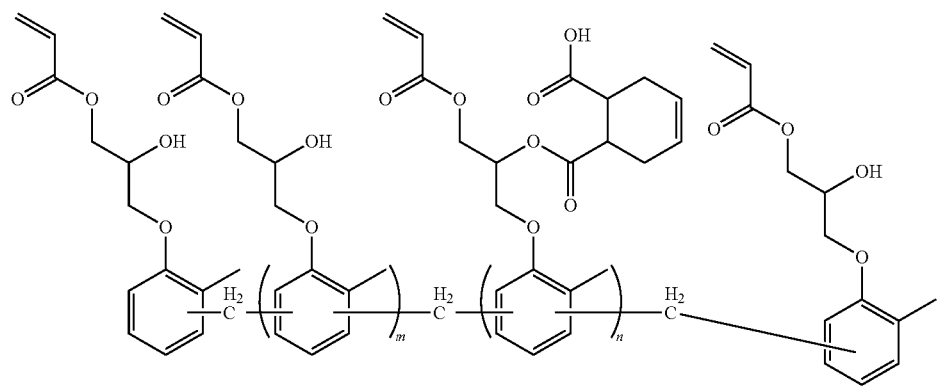

(Evaluation)

Each curable composition was evaluated as described below. The results are shown in Table 2 below.

ing force (F) at the moment was measured. The releasing force (F) was measured in accordance with the method described in [0102] to [0107] of JP2011-206977A.

TABLE 2

|   |   | Example 1 | Example 2 | Example 3 | Example 4 | Example 5 | Example 6 | Comparative Example 1 | Comparative Example 2 | Comparative Example 3 | Comparative Example 4 |
|---|---|---|---|---|---|---|---|---|---|---|---|
| (A) | A-1 | 75 | 75 | 75 | 75 | 75 | 75 | 75 | 75 | 75 | 75 |
|   | A-3 | 2 | 2 | 2 | 2 | 2 | 2 | 2 | 2 | 2 | 2 |
|   | Liquid A | 25 | 25 | 25 | 25 | 25 | 25 |   |   | 25 | 25 |
|   | A-NPG |   |   |   |   |   |   | 25 |   |   |   |
|   | NP-A |   |   |   |   |   |   |   | 25 |   |   |
|   | Compound of Formula (I) | 0.5 | 0.25 |   |   |   |   |   |   | 2 | 1 |
|   | Compound of Formula (II) | 0.5 | 0.5 | 0.5 | 0.3 | 0.1 |   |   |   | 0.5 | 0.5 |
| (B) | B-1 | 2 | 2 | 2 | 2 | 2 | 2 | 2 | 2 | 2 | 2 |
|   | B-2 | 2 | 2 | 2 | 2 | 2 | 2 | 2 | 2 | 2 | 2 |
| (C) | C | 5 | 5 | 5 | 5 | 5 | 5 | 5 | 5 | 5 | 5 |
| Formula (I)/NPGDA(%) |   | 2.0 | 1.0 | <0.1 | <0.1 | <0.1 | <0.1 | 8.2 | 7.1 | 8.1 | 4.0 |
| Formula (II)/NPGDA (%) |   | 2.0 | 2.0 | 2.0 | 1.2 | 0.4 | <0.1 | 1.7 | 1.7 | 2.0 | 2.0 |
| Viscosity (mPa · s) |   | 10.2 | 10.1 | 10.1 | 10.0 | 10.0 | 10.0 | 10.5 | 10.4 | 10.5 | 10.3 |
| IJ discharge accuracy |   | B | B | B | A | A | A | D | D | D | C |
| Releasing force (N) |   | 17.4 | 17.3 | 17.1 | 17.1 | 17.1 | 17.1 | 18.3 | 18.2 | 18.3 | 17.7 |

<Ink Jet (IJ) Discharge Accuracy>

The curable composition conditioned at a temperature of 23° C. was discharged onto a silicon wafer using an ink jet printer DMP-2831 (manufactured by FUJIFILM Dimatix, Inc.) at an amount of liquid droplets of 1 pl per nozzle, so as to form a square matrix of liquid droplets with a 100-μm pitch on the silicon wafer.

2,500 dots in a 5-mm square area on the coated substrate were observed, and the shifts from the square matrix were measured to calculate a standard deviation σ. The ink jet discharge accuracy was evaluated by ranks of A to D as described below.

A: σ<2 μm
B: 2 μm≤σ≤3 μm
C: 3 μm≤σ<4 μm
D: 4 μm≤σ

<Evaluation of Releasability>

The underlayer film composition was spin-coated on a silicon wafer, and heated on a hot plate at 100° C. for 1 minute to dry out the solvent. By further performing heating on a hot plate at 220° C. for 5 minutes to cure the underlayer film composition, an underlayer film was formed. The film thickness of the cured underlayer film was 3 nm.

The curable composition conditioned at a temperature of 23° C. was discharged onto the surface of the underlayer film on the silicon wafer, using an ink jet printer DMP-2831 (manufactured by FUJIFILM Dimatix, Inc.) at an amount of liquid droplet of 1 pl per nozzle, so as to form a square matrix of liquid droplets with a 100-μm pitch on the underlayer film.

The curable composition coated on the underlayer film was brought into contact with a quartz mold (line/space=1/1, line width=30 nm, groove depth=60 nm, line edge roughness=3.0 nm) under a reduced pressure of 0.1 atm, and then exposed from the quartz mold side using a high-pressure mercury lamp under a condition of 100 mJ/cm². After the exposure, the quartz mold was released and the mold releas-

TABLE 3

|   |   | Example 7 | Comparative Example 5 |
|---|---|---|---|
| (A) | A-2 | 75 | 75 |
|   | A-3 | 2 | 2 |
|   | Liquid A | 25 |   |
|   | A-NPG |   | 25 |
| (B) | B-1 | 2 | 2 |
|   | B-2 | 2 | 2 |
| (C) | C | 5 | 5 |
| Formula (I)/NPGDA (%) |   | <0.1 | 8.2 |
| Formula (II)/NPGDA (%) |   | <0.1 | 1.7 |
| Viscosity (mPa · s) |   | 10.2 | 10.6 |
| IJ discharge accuracy |   | B | D |
| Releasing force (N) |   | 17.5 | 18.8 |

As apparent from the results, it was found that the curable composition of Examples, having a total content of the compound of Formula (I) and the compound of Formula (II) of 5% by mass or less with respect to the content of neopentyl glycol diacrylate, has excellent releasability and ink jet discharge accuracy.

In contrast, the curable composition of Comparative Examples, having a total content of the compound of Formula (I) and the compound of Formula (II) of more than 5% by mass with respect to the content of neopentyl glycol diacrylate, has high viscosity and deteriorated ink jet discharge accuracy, as well as deteriorated releasability.

In addition, the IJ discharge accuracy is affected even by a variation in viscosity of 0.1 mPa·s.

What is claimed is:
1. A curable composition comprising:
a polymerizable compound; and
a photopolymerization initiator,
wherein neopentyl glycol diacrylate accounts for 10% by mass or more of the polymerizable compound, and the total content of a compound represented by the following Formula (I) and a compound represented by the following Formula (II) is 5% by mass or less with respect to the content of neopentyl glycol diacrylate:

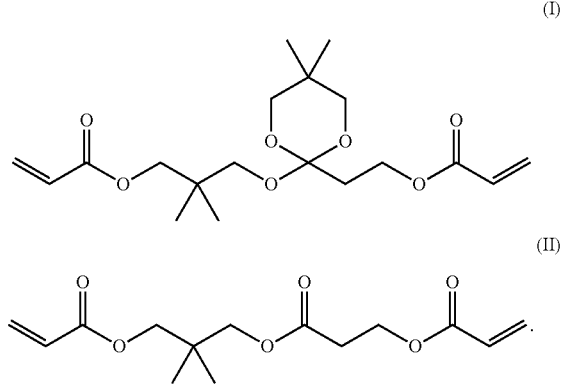

2. The curable composition according to claim 1, wherein the content of the compound represented by Formula (I) is 2% by mass or less with respect to the content of neopentyl glycol diacrylate.

3. The curable composition according to claim 1, wherein the content of the compound represented by Formula (II) is 2% by mass or less with respect to the content of neopentyl glycol diacrylate.

4. The curable composition according to claim 1, wherein the polymerizable compound further includes a polymerizable compound having one selected from an alicyclic hydrocarbon structure and an aromatic structure.

5. The curable composition according to claim 1, which is used for imprints.

6. The curable composition according to claim 1, which is used for ink jet.

7. A pattern forming method comprising:
   applying the curable composition according to claim 1 on a base material or a mold having a pattern; and
   irradiating the curable composition with light in a state of keeping the composition sandwiched between the mold and the base material.

8. The pattern forming method according to claim 7, wherein the method for applying the curable composition on the base material or the mold having a pattern is an ink jet method.

9. A pattern obtained by the pattern forming method according to claim 7.

10. A method for manufacturing a device, comprising:
    the pattern forming method according to claim 7.

* * * * *